United States Patent
Grivna et al.

(10) Patent No.: US 8,466,513 B2
(45) Date of Patent: Jun. 18, 2013

(54) SEMICONDUCTOR DEVICE WITH ENHANCED MOBILITY AND METHOD

(75) Inventors: Gordon M. Grivna, Mesa, AZ (US); Zia Hossain, Tempe, AZ (US); Kirk K. Huang, Chandler, AZ (US); Balaji Padmanabhan, Tempe, AZ (US); Francine Y. Robb, Fountain Hills, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 113 days.

(21) Appl. No.: 13/159,255

(22) Filed: Jun. 13, 2011

(65) Prior Publication Data

US 2012/0313161 A1 Dec. 13, 2012

(51) Int. Cl.
*H01L 29/66* (2006.01)

(52) U.S. Cl.
USPC ............ 257/329; 257/342; 257/341; 257/334

(58) Field of Classification Search
USPC .......................... 438/270–272; 257/329–334
See application file for complete search history.

(56) References Cited

U.S. PATENT DOCUMENTS

| | | | |
|---|---|---|---|
| 5,998,833 A | 12/1999 | Baliga | |
| 7,238,985 B2 * | 7/2007 | Jones et al. | 257/330 |
| 7,344,943 B2 | 3/2008 | Herrick et al. | |
| 7,361,539 B2 | 4/2008 | Chen et al. | |
| 7,452,777 B2 | 11/2008 | Kocon et al. | |
| 7,485,544 B2 | 2/2009 | Forbes et al. | |
| 7,504,306 B2 | 3/2009 | Sapp et al. | |
| 7,525,162 B2 | 4/2009 | Yin et al. | |
| 7,585,720 B2 | 9/2009 | Sudo | |
| 7,741,185 B2 | 6/2010 | Tanabe | |
| 7,767,540 B2 | 8/2010 | Peidous et al. | |
| 8,187,950 B2 * | 5/2012 | Ang | 438/433 |
| 2004/0232410 A9 | 11/2004 | Dahmani et al. | |
| 2005/0093030 A1 | 5/2005 | Doris et al. | |
| 2005/0181536 A1 * | 8/2005 | Tsuji | 438/105 |
| 2007/0126055 A1 | 6/2007 | Hueting et al. | |
| 2008/0150020 A1 * | 6/2008 | Challa et al. | 257/331 |
| 2008/0280412 A1 * | 11/2008 | Tsuji | 438/285 |
| 2009/0014807 A1 | 1/2009 | Tang et al. | |
| 2009/0079011 A1 | 3/2009 | Chidambarrao et al. | |
| 2010/0171171 A1 | 7/2010 | Hsu et al. | |
| 2010/0252882 A1 * | 10/2010 | Denison et al. | 257/337 |

OTHER PUBLICATIONS

Moens; Stress-Induced Mobility Enhancement for Integrated Power Transistors; IEEE, IEDM 2007; pp. 877-880; Dec. 2007.
Wang; Enhanced Electrical and Thermal Properties of Trench Metal-Oxide-Semiconductor Field-Effect Transistor Built on Copper Substrate; IEEE Electron Device Letters, vol. 30, No. 1, Jan. 2009.
Anonymous; Trench PowerFET with Improved Switching Performance; www.ip.com; IP.com No. IPCOM000161992D; Dec. 12, 2007.

* cited by examiner

*Primary Examiner* — Cheung Lee
*Assistant Examiner* — Christopher Johnson
(74) *Attorney, Agent, or Firm* — Kevin B. Jackson

(57) ABSTRACT

In one embodiment, a vertical insulated-gate field effect transistor includes a feature embedded within a control electrode. The feature is placed within the control electrode to induce stress within predetermined regions of the transistor.

35 Claims, 11 Drawing Sheets

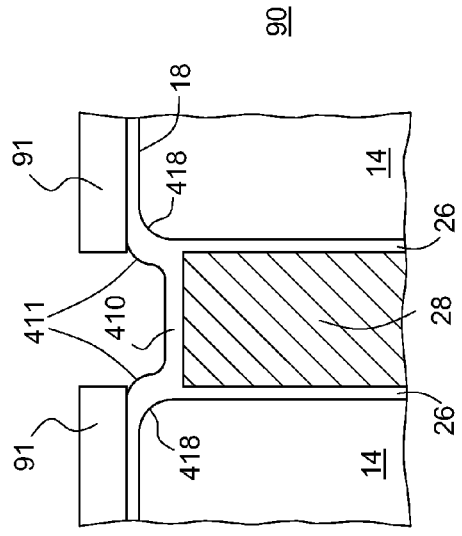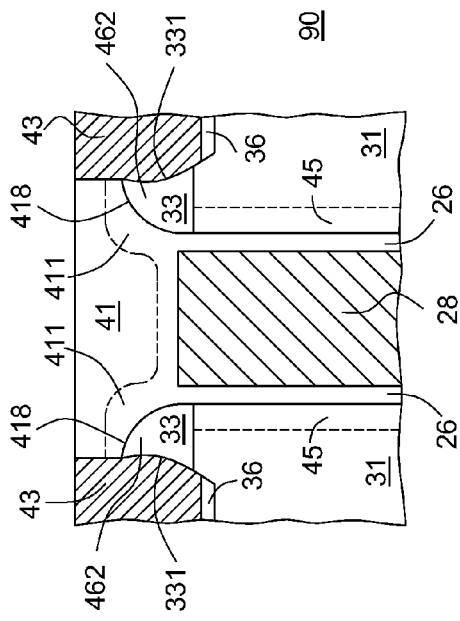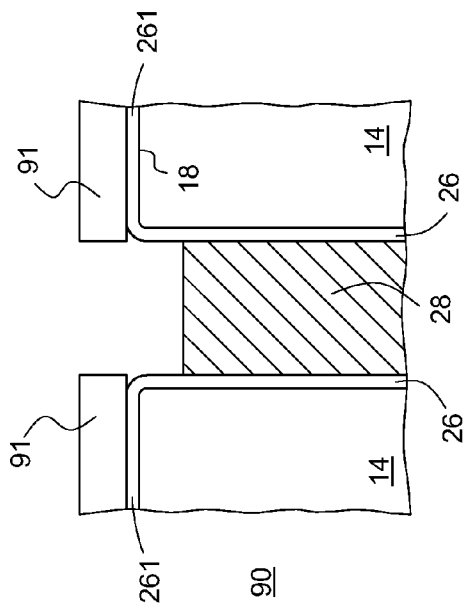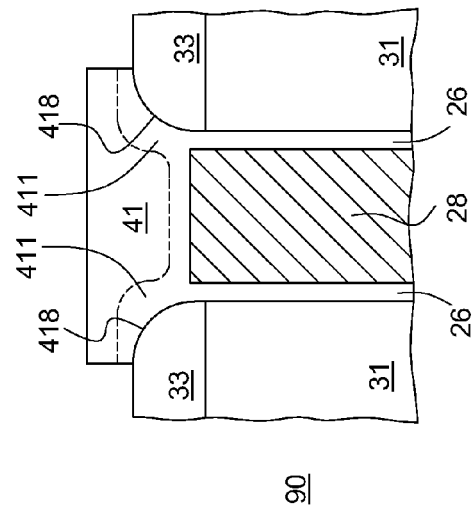

SEMICONDUCTOR DEVICE WITH ENHANCED MOBILITY AND METHOD

BACKGROUND OF THE INVENTION

This document relates generally to semiconductor devices, and more specifically to insulated gate structures and methods of formation.

Metal oxide field effect transistor (MOSFET) devices are used in many power switching applications such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of MOSFET devices where the gate electrode is formed in a trench that extends downward from a major surface of a semiconductor material such as silicon. Current flow in this class of devices is primarily vertical and, as a result, device cells can be more densely packed. All else being equal, this increases the current carrying capability and reduces on-resistance of the device.

Achieving the lowest specific on-resistance (ohm-area) is an important goal of MOSFET device designers because it determines product cost and gross margins or profitability. In particular, the lower the specific on-resistance, the smaller the size of the MOSFET die or chip, which leads to lower costs in semiconductor materials and package structures.

Various methods are known for reducing on-resistance. Such methods include using advanced lithography and self-aligned structures to increase device density; adding recessed field plates or shield electrodes, which allow the use of higher drift region dopant concentrations; and using thinner and higher dopant concentration semiconductor substrates. Also, various packaging techniques have been implemented including certain mold compounds that provide stress induced carrier mobility enhancement. Additionally, in very low voltage advanced deep submicron CMOS devices (less than 5 volts) used in logic applications, enhanced carrier mobility has been achieved in planar gate structures by encapsulating the outer and upper surfaces of the gate electrode and portions of the outer surfaces of the source and drain regions with a stressed silicon-nitride film. Further, lattice mismatch semiconductor structures such as silicon-germanium devices have been proposed to enhance carrier mobility in power transistor devices, which in turn reduces on-resistance. However, such structures suffer from manufacturing drawbacks including lowered thermal budgets and reliability issues.

Accordingly, structures and methods of manufacture are needed to effectively further reduce on-resistance in power semiconductor devices such as vertical trench-gated semiconductor devices.

BRIEF DESCRIPTION OF THE DRAWINGS

FIGS. 9-12 illustrate partial cross-sectional views of another semiconductor device at various stages of fabrication in accordance with another method of the present invention.

Figure 1:
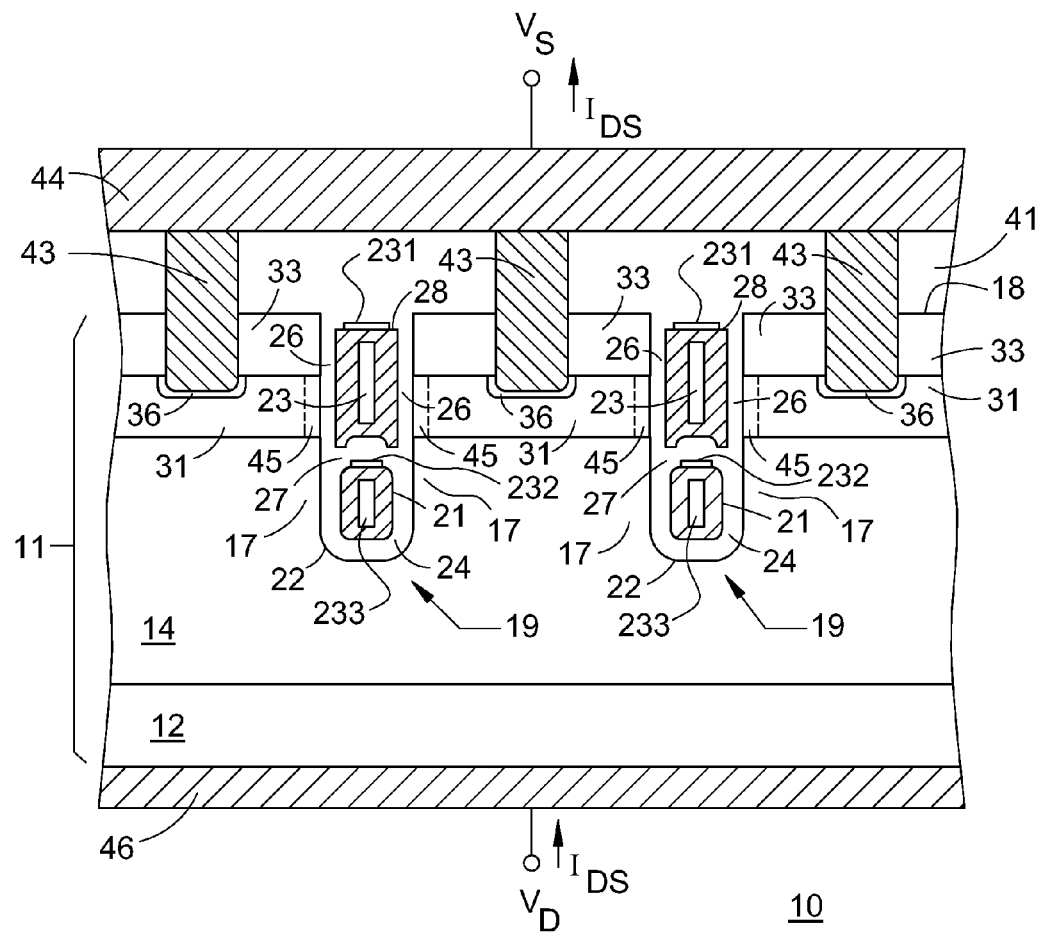
FIG. 1 illustrates a partial cross-sectional view of a semiconductor structure in accordance with a first embodiment of the present invention.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel devices, a person of ordinary skill in the art will appreciate that P-channel devices and complementary devices are also possible in accordance with the present description. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

Further, the term "major surface" when used in conjunction with a semiconductor region or substrate means the surface of the semiconductor region or substrate that forms an interface with another material such as a dielectric or insulator, a conductor, a polycrystalline semiconductor. The major surface can have a topography that changes in the x, y and z directions.

In addition, structures of the present description may embody either a cellular base design (where the body regions are a plurality of distinct and separate cellular or stripe regions) or a single base design (where the body region is a single region formed in an elongated pattern, typically in a serpentine pattern or a central portion with connected appendages). However, one embodiment of the present description will be described as a cellular base design throughout the description for ease of understanding. It should be understood that it is intended that the present disclosure encompass both a cellular base design and a single base design.

DETAILED DESCRIPTION OF THE DRAWINGS

In general, the present description pertains to a power semiconductor device. In one embodiment the power semiconductor device includes a trench gate electrode structure. In another embodiment the power semiconductor device can also include a shield electrode structure. Features that induce or propagate stress in predetermined locations of the power semiconductor device are formed in spaced relationship with trench gate electrode structure, the shield electrode structure, adjacent contact regions, regions there between, or combinations thereof. The features enhance carrier mobility, which in turn improves device performance parameters such as on-resistance.

FIG. 1 shows a partial cross-sectional view of a semiconductor device 10 or cell 10 having features or structures configured to create, propagate, induce, or generate stress within predetermined locations or regions of device 10. Device 10, as well as the other devices described herein, can comprise a plurality of such devices integrated as a discrete device and/or integrated with other functionality as a power integrated circuit.

In this embodiment, device 10 can be configured as a vertical power MOSFET structure, but it is understood that this description applies as well to lateral power MOSFET structures, insulated gate bipolar transistors (IGBT), MOS-gated thyristors, and the like. Device 10 includes a region of semiconductor material, semiconductor material, or semiconductor region 11, which can be for example, an n-type silicon substrate 12 having a resistivity in a range from about 0.001 ohm-cm to about 0.005 ohm-cm. Substrate 12 can be doped with phosphorous or arsenic. In the embodiment shown, substrate 12 provides a drain region, drain contact or a first current carrying contact for device 10.

A semiconductor layer, drift region, or extended drain region 14 can be formed in, on, or overlying substrate 12. In one embodiment, semiconductor layer 14 can be formed using semiconductor epitaxial growth techniques. Alternatively, semiconductor layer 14 can be formed using semiconductor doping and diffusion techniques. In an embodiment suitable for a 50 volt device, semiconductor layer 14 can be n-type with a dopant concentration of about $1.0 \times 10^{16}$ atoms/cm$^3$ and can have a thickness from about 3 microns to about 5 microns. The thickness and dopant concentration of semiconductor layer 14 can be increased or decreased depending on the desired drain-to-source breakdown voltage ($BV_{DSS}$) rating of device 10. In another embodiment, semiconductor layer 14 can comprise a plurality of epitaxial layers having different dopant concentrations and thicknesses. In another embodiment, semiconductor layer 14 can comprises a single epitaxial layer having a graded dopant profile. In an alternate embodiment, the conductivity type of substrate 12 can be switched to be opposite to the conductivity type of semiconductor layer 14 to form, for example, an IGBT embodiment.

Device 10 also includes a body, base, or doped region or regions 31 extending from a major surface 18 of semiconductor material 11. Body regions 31 can have a conductivity type that is opposite to the conductivity type of semiconductor layer 14. In this example, body regions 31 are p-type conductivity. Body regions 31 have a dopant concentration configured for forming inversion layers that operate as conduction channels or channel regions 45 of device 10. Body regions 31 can extend from major surface 18 to a depth, for example, from about 0.5 microns to about 2.0 microns. In this embodiment, n-type source regions, current conducting regions, or current carrying regions 33 are formed within, in, or overlying body regions 31 and can extend from major surface 18 to a depth, for example, from about 0.1 microns to about 0.5 microns. A p-type body contact, enhancement region, or contact region 36 can be formed in body regions 31, and typically is configured to provide a lower contact resistance to body regions 31.

Device 10 can further include trench control, trench gate, or trench structures 19, which typically extend in a substantially vertical direction from major surface 18. Alternatively, trench control structures 19 or portions thereof can have a tapered shape. Trench structures 19 include trenches 22, which can be formed within region of semiconductor material 11. For example, trenches 22 can have a depth from about 1.5 microns to about 2.5 microns or shallower or deeper. In one embodiment, trenches 22 can extend all the way through semiconductor layer 14 into substrate 12. In another embodiment, one or more trenches 22 can terminate within semiconductor layer 14.

In this embodiment, dielectric layers, insulator layers, field insulator layers or regions 24 are formed on lower portions of trenches 22. In one embodiment, insulator layers 24 can be silicon oxide, and can have a thickness from about 0.1 microns to about 0.2 microns. Additionally, the thickness of layer 24 can be increased or decreased, depending on the desired drain-to-source breakdown voltage ($BV_{DSS}$). Shield electrodes 21 are formed adjacent insulator layers 24 typically in substantially centrally located lower portions of trenches 22. In one embodiment, shield electrodes 21 comprise doped polycrystalline semiconductor material. In other embodiments, shield electrodes 21 can comprise other conductive materials.

Dielectric or insulator layers 26 typically are formed along upper sidewall portions of trenches 22, and can be configured as gate dielectric regions or layers. By way of example, insulator layers 26 typically comprise oxide, nitride, tantalum pentoxide, titanium dioxide, barium strontium titanate, hafnium oxide, combinations thereof, or the like. In one embodiment, insulator layers 26 comprise silicon oxide and can have a thickness from about 0.01 microns to about 0.1 microns. In one embodiment, insulator layers 24 can be thicker than insulator layers 26. Dielectric or insulator layers 27 typically are formed overlying shield electrodes 21, and in one embodiment, insulator layers 27 can have a thickness that is between or greater than the thickness of insulator layers 24 and insulator layers 26. In one embodiment, insulator layers 27 can have a thickness greater than the thickness of insulator layer 26, which can improve oxide breakdown voltage performance. In one embodiment, insulator layers 27 can have a thickness between about 0.1 microns to about 0.3 microns.

In this embodiment, trench structures 19 typically include control electrodes or gate electrodes 28, which are formed adjacent insulator layers 26 and 27. In one embodiment, gate electrodes 28 can comprise doped polycrystalline semiconductor material such as polysilicon doped with an n-type dopant.

Device 10 further includes one or more features such as structures or stressed films 23, 231, 232, and/or 233, which are configured to create, propagate, induce, or generate stress within predetermined locations or regions of device 10. Such predetermined locations can include channel regions 45 and/or drift regions 17. By way of example, structures 23, 231, 232, and 233 comprise a stressed film or stress inducing film such as dielectric films including a silicon nitride, a silicon oxynitride, or a silicon oxide, combinations thereof, or the like. Alternatively, structures 23, 231, 232, and 233 can comprise conductive films such as silicides or metals. In further embodiments, such structures can comprise undoped polysilicon, semi-insulating polysilicon ("SIPOS"), or the like.

In one embodiment, structures 23 can be formed within gate electrodes 28 and in proximity to channel regions 45. In one embodiment, structures 23 can be substantially centrally located within gate electrodes 28. In one embodiment, structures 23 can be placed less than or equal to approximately 0.2 microns from channel regions 45. By way of example, structure 23 typically is configured to generate stress such as tensile stress in proximity to channel regions 45 within region of semiconductor material 11 when device 10 comprises an n-channel device. Stated another way, structure 23 is under compressive stress to generate tensile stress in proximity to channel regions 45 within region of semiconductor material 11. When device 10 comprises a p-channel device, structure 23 is under tensile stress in order to generate a compressive stress in proximity to channel regions 45.

Structures 231 can be formed overlying gate electrodes 28 or in proximity to upper surfaces of gate electrodes 28. Structures 231 are configured to generate stress such as tensile stress in proximity to source ends of channel regions 45. Stated another way, structures 231 can be under compressive stress to generate tensile stress in proximity to the source ends of channel regions 45 within region of semiconductor material 11. When device 10 comprises a p-channel device, structures 231 can be under tensile stress in order to generate a compressive stress in proximity to channel regions 45.

Structures 232 can be formed overlying shield electrodes 21. Structures 232 are configured, for example, to generate stress such as tensile stress in proximity to drain ends of channels 45 and in proximity to drift regions 17. Stated another way, structures 232 can be under compressive stress to generate tensile stress in proximity to the drain ends of channel regions 45 and in proximity to drift regions 17 within region of semiconductor material 11. When device 10 comprises a p-channel device, structures 232 can be under tensile stress in order to generate a compressive stress in proximity to the drain ends of channel regions 45 and in proximity to drift regions 17.

Structures 233 can be formed within shield electrodes 21. Structures 233 are configured, for example, to generate stress such as tensile stress in proximity the drain ends of channel regions 45 and in proximity to drift regions 17. Stated another way, structures 233 can be under compressive stress to generate tensile stress in proximity to the drain ends of channel regions 45 and in proximity to drift regions 17 within region of semiconductor material 11. When device 10 comprises a p-channel device, structures 233 can be under tensile stress in order to generate a compressive stress in proximity to the drain ends of channel regions 45 and in proximity to drift regions 17.

It is understood that one or more of structures 23, 231, 232, and 233 can be used with device 10. In addition, structures 23, 231, 232, and 233 can comprise stripe-like shapes. In one embodiment, structures 23 and 233 can be rectangular in cross-section with the longest sides running substantially parallel to channel regions 45 and drift regions 17 respectively. In other embodiments, the longest sides can run substantially perpendicular to channel regions 45. In one embodiment, structures 23 can have a length that is equal to or greater than the length of channels 45. In one embodiment, structures 23 can have a length that is less than the length of channels 45.

In accordance with the present embodiment, structures 23, 231, 232, and 233 increase carrier mobility, which in turn reduces on-resistance for device 10. By way of example, simulation results show that such structures can reduce on-resistance by at least 5% to 30%. One benefit of structures 23, 231, 232 or/and 233 is that these structures can facilitate a device active area shrink, which can mean more functional devices in a given area or a reduction in the actual chip size. Simulations of these structures suggest active area shrinks of about 5% to 30%.

An interlayer dielectric (ILD), dielectric, or insulator layer 41 is formed overlying major surface 18 and above trench structures 19. In one embodiment, dielectric layer 41 comprises a silicon oxide and can have a thickness from about 0.4 microns to about 1.0 microns. In one embodiment, dielectric layer 41 comprises a deposited silicon oxide doped with phosphorous or boron and phosphorous. In one embodiment, dielectric layer 41 can be planarized to provide a more uniform surface topography, which improves manufacturability.

Conductive regions or plugs 43 are formed through openings, contact trenches, or vias in dielectric layer 41 and portions of semiconductor layer 14 to provide for electrical contact to source regions 33 and body regions 31 through contact regions 36. In one embodiment, conductive regions 43 are conductive plugs or plug structures. In one embodiment, conductive regions 43 comprise a conductive barrier structure or liner plus a conductive fill material. In one embodiment, the barrier structure includes a metal/metal-nitride configuration such as titanium/titanium-nitride or the like. In another embodiment, the barrier structure can further include a metal-silicide structure. In one embodiment, the conductive fill material includes tungsten. In one embodiment, conductive regions 43 are planarized to provide a more uniform surface topography.

A conductive layer 44 can be formed overlying major surface 18 and a conductive layer 46 can be formed overlying a surface of semiconductor material 11 opposite major surface 18. Conductive layers 44 and 46 typically are configured to provide electrical connection between the individual device components of device 10 and a next level of assembly. In one embodiment, conductive layer 44 is titanium/titanium-nitride/aluminum-copper or the like and is configured as a source electrode or terminal. In one embodiment, conductive layer 46 is a solderable metal structure such as titanium-nickel-silver, chromium-nickel-gold, or the like and is configured as a drain electrode or terminal. In one embodiment, a further passivation layer (not shown) is formed overlying conductive layer 44. In one embodiment, shield electrodes 21 are connected (in another plane) to conductive layer 44 so that shield electrodes 21 are configured to be at the same potential as source regions 33 when device 10 is in use. In another embodiment, shield electrodes 21 can be configured to be independently biased. In a further embodiment, a portion of shield electrodes 21 can be electrically connected to gate electrodes 28.

In one embodiment, the operation of device 10 proceeds as follows. Assume that source electrode (or input terminal) 44 and shield electrodes 21 are operating at a potential $V_S$ of zero volts, gate electrodes 28 receive a control voltage $V_G$ of 4.5 volts, which is greater than the conduction threshold of device 10, and drain electrode (or output terminal) 46 operates at a drain potential $V_D$ of less than 2.0 volts. The values of $V_G$ and $V_S$ cause body region 31 adjacent to gate electrodes 28 to invert to form channels 45, which electrically connect source regions 33 to semiconductor layer 14. A device current $I_{DS}$ flows from drain electrode 46 and is routed through semiconductor layer 14, channels 45, and source regions 33 to source electrode 44. In one embodiment, $I_{DS}$ is on the order of 10.0 amperes. In accordance with the present embodiment, structures 23, 231, 232, and/or 233 propagate stress into region of semiconductor material 11, which increases carrier mobility within channels 45 and/or drift regions 17. This in turn reduces on-resistance for device 10. To switch device 10 to the off state, a control voltage $V_G$ of less than the conduction threshold of device 10 is applied to gate electrodes 28 (e.g., $V_G$<2.5 volts). This removes channels 45 and $I_{DS}$ no longer flows through device 10.

Figure 2:
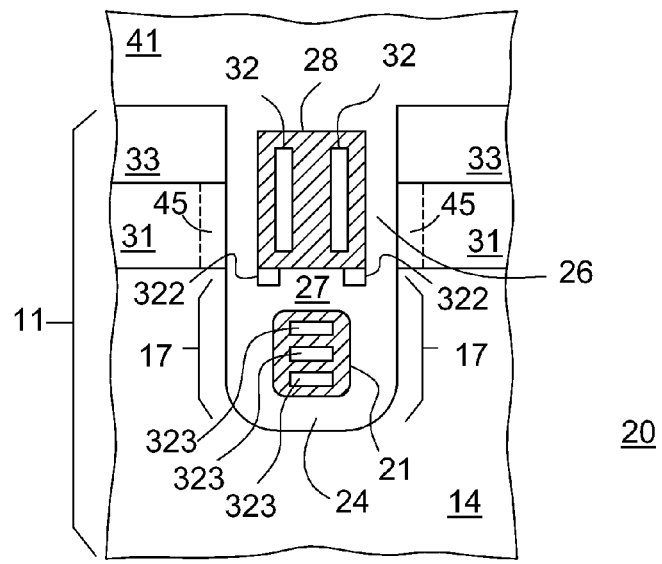
FIG. 2 illustrates a partial cross-sectional view of a semiconductor structure in accordance with a second embodiment of the present invention.

FIG. 2 shows a partial cross-sectional view of a semiconductor device 20 in accordance with a second embodiment.

Device 20 is similar to device 10, but includes alternative features or structures configured to create, propagate, induce, or generate stress within predetermined locations or regions of device 20. Specifically, device 20 can include one more structures 32, 322, and 323, which can comprise a stressed film or stress inducing film such as a dielectric film including a silicon nitride, a silicon oxynitride, or a silicon oxide, combinations thereof, or the like. Alternatively, structures 32, 322, and 323 can comprise conductive films such as silicides or metals. Further, such structure can comprise undoped polysilicon or SIPOS. In one embodiment, structures 32, 322, and 323 are placed within less than or equal to about 0.2 microns of the region where it is desired the stress be induced.

In this embodiment, structures 32 can be formed within gate electrode 28 to induce stress such as tensile stress within channel regions 45. Stated another way, structures 32 can be under compressive stress to generate tensile stress in proximity to channel regions 45 within region of semiconductor material 11 when device 20 comprises an n-channel device. When device 20 comprises a p-channel device, structures 32 can be under tensile stress in order to generate a compressive stress in proximity to channel regions 45. By way of example, structures 32 can be a plurality of spaced-apart stripe-like shapes having rectangular cross-sections with the longer sides placed approximately parallel to channel regions 45. In other embodiments, the longer sides can be placed approximately perpendicular to channel regions 45. It is understood that structures 32 can comprise one or more structures.

Structures 322 can be placed, for example, at lower and outer tip portions of gate electrode 28. Structures 322 are configured or placed to induce or propagate stress such as tensile stress within region of semiconductor material 11 (e.g., semiconductor layer 14) in proximity to the drain-end of channel regions 45 and drift regions 17. Stated another way, structures 322 can be under compressive stress to generate tensile stress in proximity to channel regions 45 and in proximity to drift regions 17 when device 20 comprises an n-channel device. When device 20 comprises a p-channel device, structures 322 can be under tensile stress in order to generate a compressive stress in proximity to channel regions 45 and in proximity to drift regions 17.

Structures 323 can be placed, for example, within shield electrodes 21, and can be a pair of spaced-apart stripe-like shapes having rectangular cross-sections with the longer sides placed approximately perpendicular to the direction of channel regions 45. In another embodiment, the longer sides of structures 323 can placed approximately parallel to the direction of channel regions 45. Structures 322 are configured or placed to induce or propagate stress such as tensile stress within drift regions 17. Stated another way, structures 323 can be under compressive stress to generate tensile stress in proximity to drift regions 17 when device 20 comprises an n-channel device. When device 20 comprises a p-channel device, structures 323 can be under tensile stress in order to generate a compressive stress in proximity to drift regions 17. In accordance with the present embodiment, structures 32, 322, and 323 increase carrier mobility in the regions under stress, which in turn reduces on-resistance for device 20.

Figure 3:
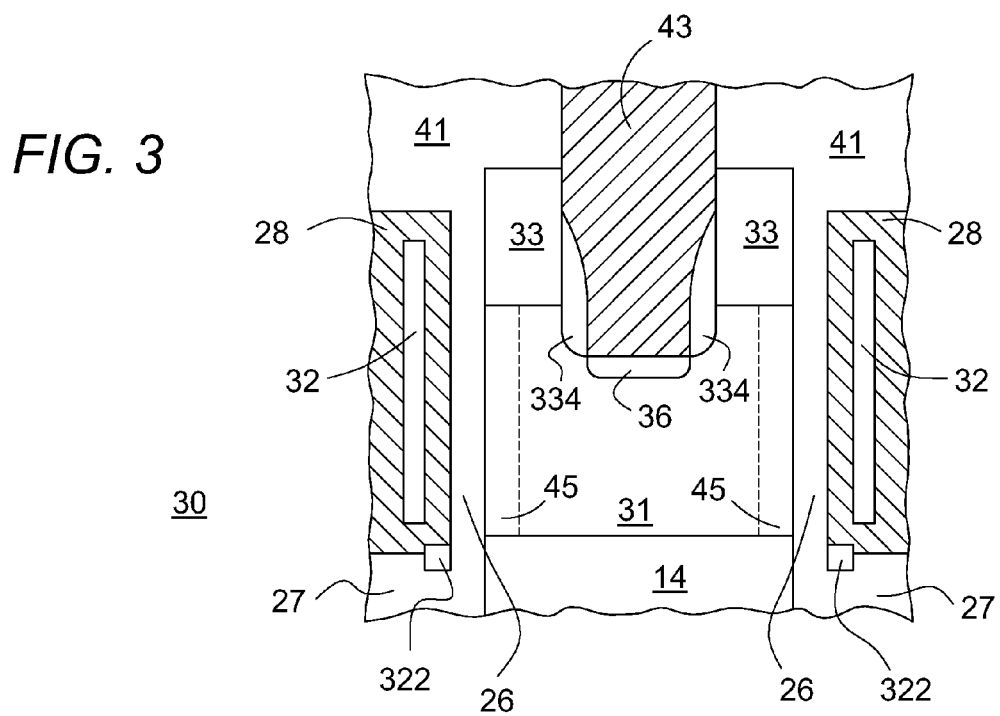
FIG. 3 illustrates a partial cross-sectional view of a semiconductor structure in accordance with a third embodiment of the present invention.

FIG. 3 is a partial cross-sectional view of a device 30 in accordance with another embodiment. Device 30 is similar to devices 10 and 20. Device 30 further includes structures 334 that can be placed within, adjacent or below conductive structures 43, and are configured or placed to induce stress in proximity to source-ends of channels 45. Structures 334 comprise a stressed film or stress inducing film such as dielectric films including a silicon nitride, a silicon oxynitride, or a silicon oxide, or undoped polysilicon, SIPOS, or combinations thereof, or the like. Structures 334 can be used by themselves or together with any of the stress-inducing structures described herein. When device 30 comprises an n-channel device, structures 334 can be under compressive stress to generate tensile stress in proximity to the source ends of channel regions 45. When device 30 comprises a p-channel device, structures 334 can be under tensile stress to generate compressive stress in proximity to the source ends of channel regions 45.

Figure 4:
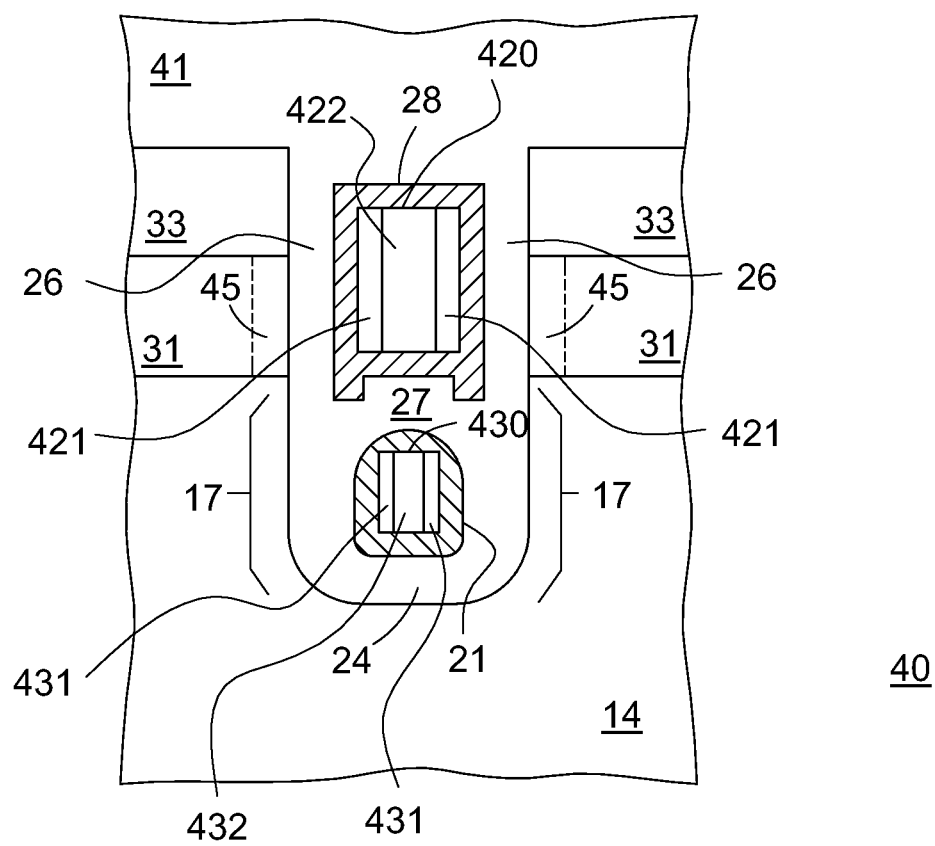
FIG. 4 illustrates a partial cross-sectional view of a semiconductor structure in accordance with a fourth embodiment of the present invention.

FIG. 4 is a partial cross-sectional view of a device 40 in accordance with a further embodiment. Device 40 is similar to devices 10 and 20, and further includes composite or multi-layered structures 420 and 430 for inducing or propagating stress within various segments of device 40. For example, when device 40 is an n-channel device, structures 420 and 430 can be under compressive stress to induce a tensile stress within the various segments. Alternatively, when device 40 comprises a p-channel device, structures 420 and 430 can be under tensile stress to induce a compressive stress within the various segments.

Composite structure 420 can include multiple layers including different materials. For example, composite structure 420 is formed or placed within gate electrode 28 to induce stress in proximity to or within channel regions 45. In one embodiment, composite structure 420 can include a region 422 of one material sandwiched or placed between a pair of regions 421 of different material. For example, region 422 can comprise an oxide, and regions 421 can comprise a nitride or a conductive material such as a silicide. Alternatively, region 422 can comprise a nitride and regions 421 can comprise an oxide or a conductive material such as a silicide. In an optional embodiment, device 40 can include a composite structure 430, which includes a region 432 of one material sandwiched or placed between a pair of regions 431 of a different material. For example, region 432 can comprise an oxide, and regions 431 can comprise a nitride or a conductive material such as a silicide. Alternatively, region 432 can comprise a nitride and regions 431 can comprise an oxide or a conductive material such as a silicide. It is understood that structures 420 and 430 can be rotated. For example, they can be rotated 90 degrees from what is shown in FIG. 4.

Figure 5:
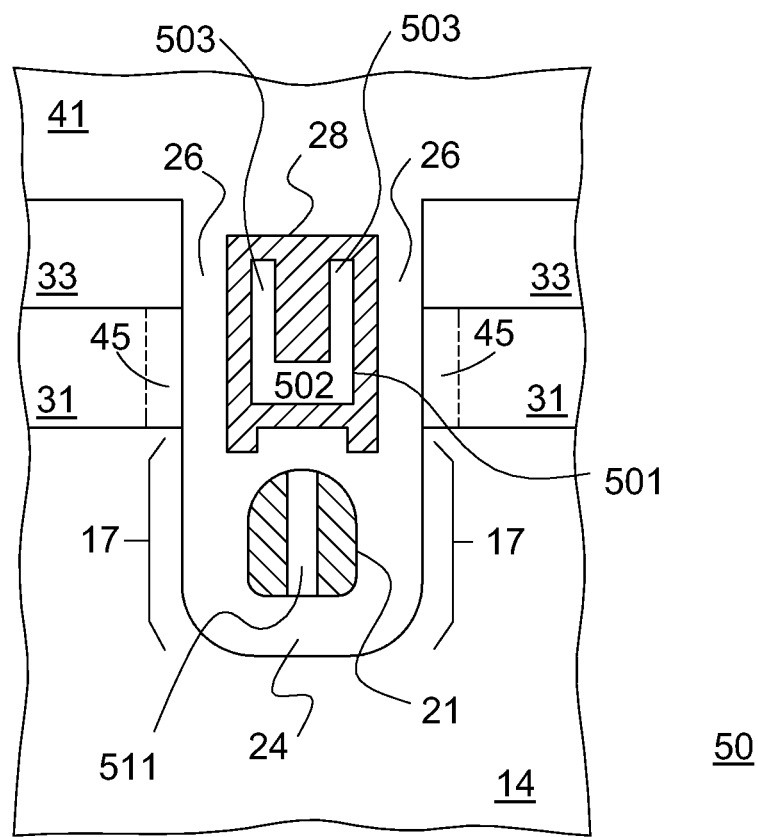
FIG. 5 illustrates a partial cross-sectional view of a semiconductor structure in accordance with a fifth embodiment of the present invention.

FIG. 5 is a partial cross-section view of a device 50 in accordance with a still further embodiment. Device 50 is similar to devices 10 and 20. Device 50 includes structures 501 and optionally 511 for inducing stress within specific or predetermined locations or parts of device 50. For example, when device 50 comprises an n-channel device, structures 501 and 511 can be under compressive stress to induce a tensile stress within the predetermined locations or parts. Alternatively, when device 50 comprises a p-channel device, structures 501 and 511 can be under tensile stress to induce a compressive stress within the specific locations or parts. In this embodiment, structure 501 can be a "U" like shape or horseshoe like shape with a base portion 502 and side portions 503 extending away from base portion 502. Base portion 502 can be thicker than side portions 503. Structure 501 comprises a stressed film or stress inducing material such as dielectric films including a silicon nitride, a silicon oxynitride, or a silicon oxide, or undoped polysilicon, or SIPOS, or combinations thereof, or the like. Alternatively, structure 501 can comprise conductive films such as silicides or metals. Structure 501 is placed within gate electrode 28 for inducing stress, for example, in channel regions 45. In one embodiment, structure 501 can be inverted or rotated 180 degrees from the orientation shown in FIG. 5. One further advantage of structure 511 is that it can reduce the capacitance between gate electrode 28 and shield electrode 21.

Structure 511 is a stripe-like structure that bisects or passes through shield electrode 21. Structure 511 comprises materials similar to those materials described for structures 233 and 323. Structure 511 can be placed within shield electrode 21 for inducing stress, for example in drift regions 17. It is understood that structure 501 can be used within shield electrode 21 as well.

Figure 6:
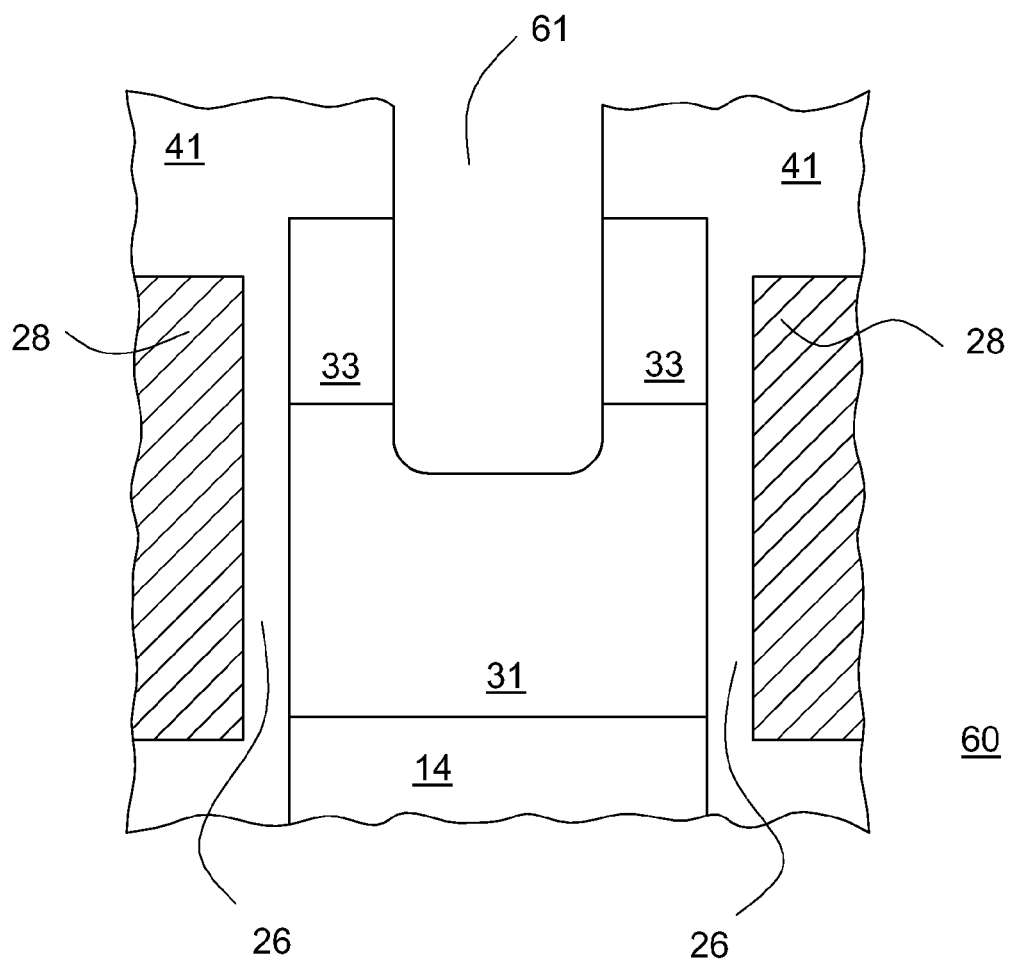
FIGS. 6-8 illustrate partial cross-sectional views of a semiconductor device at various stages of fabrication in accordance with a method of the present invention.
Figure 7:
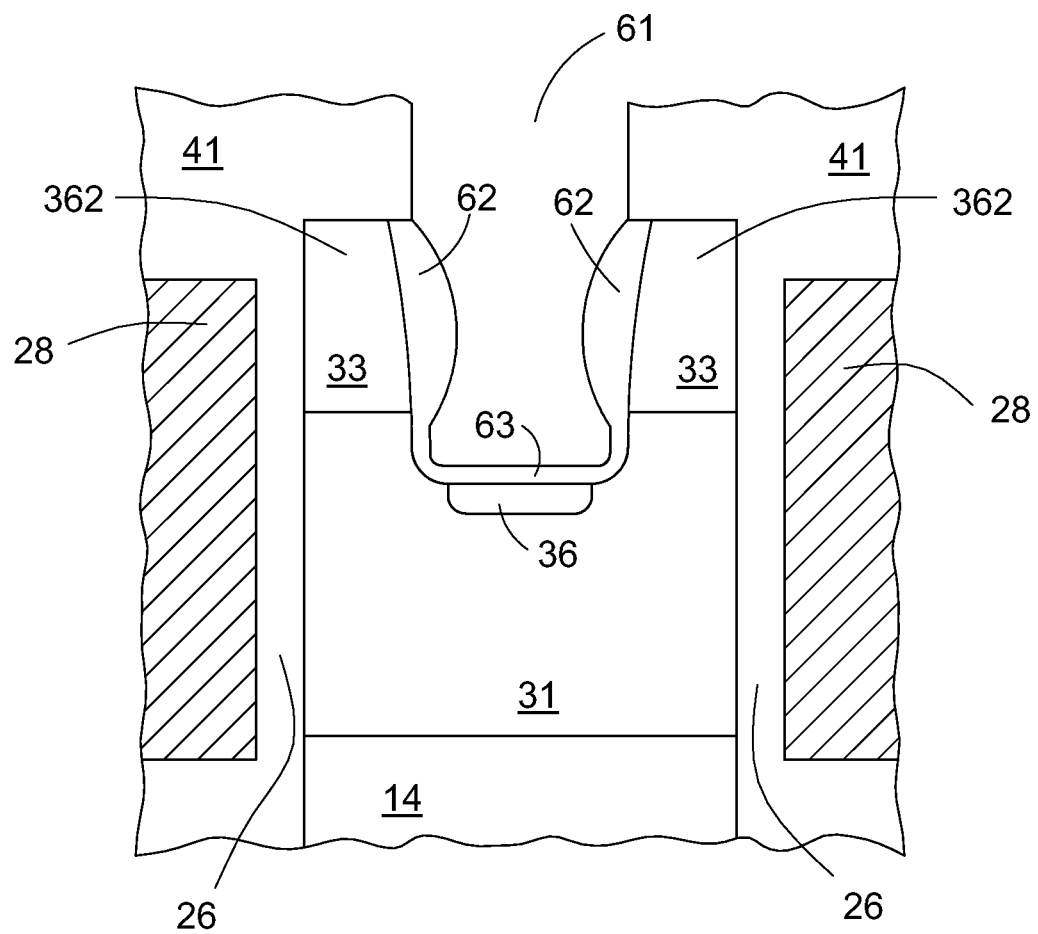
Figure 8:
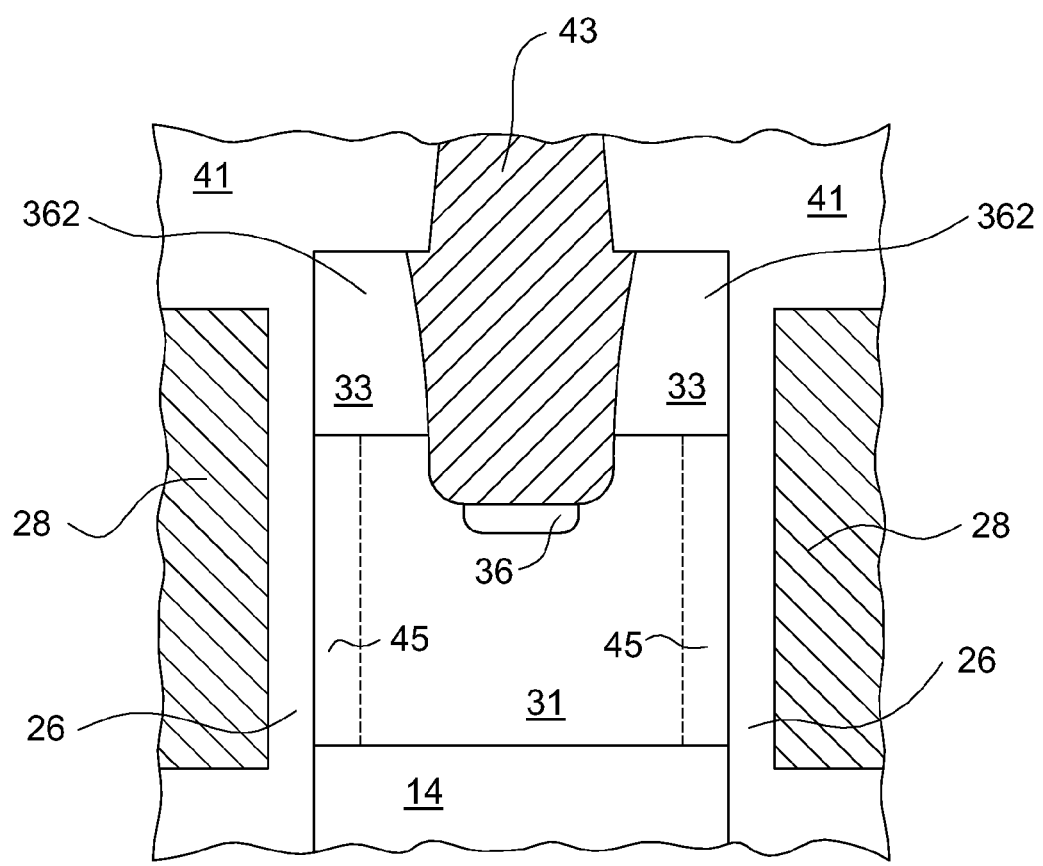

FIGS. 6-8 are partial cross-sectional views of a device 60 at various steps of fabrication, which illustrate a method of forming regions 362 within source regions 33, which are configured to induce stress within the source ends of channels 45. FIG. 6 shows device 60 after a contact opening 61 is formed through ILD layer 41, portions of source regions 33 and extends into body region 31. Next, a thermal oxide process can be used to form an insulating layer along exposed portions of the source regions 33 and body region 31 as shown in FIG. 7. In one embodiment, a wet oxide formed using a temperature from about 825 degrees Celsius to about 925 degrees Celsius and a time from about 3 minutes to about 10 minutes. With this process, the insulating layer is formed having a thicker portion 62 in proximity to source regions 33 and a thinner portion 63 in proximity to body region 31. Thicker portions 62 provide an offset for incorporating dopant into body region 31 to form enhancement region 36. The insulating layer can then subsequently removed and conductive region 43 formed within contact opening 61 as shown in FIG. 8. The above described process for forming the insulating layer having thicker portions 62 was found to form regions 362 of elevated stress that beneficially propagates to channel regions 45. Specifically, regions 362 were found to reduce on-resistance by about 3% to about 6%.

FIGS. 9-12 are partial cross-sectional views of a device 90 at various steps of fabrication to illustrate a method of forming regions 462 within source regions 33, which induce stress within or in proximity to the source ends of channels 45. FIG. 9 shows device 90 after gate electrode 28 has been formed. For example, when gate electrode 28 comprises doped polysilicon, a silicon recess etch is used to etch the polysilicon below major surface 18 as shown in FIG. 9. For this step, a hard mask layer 91 can be used while forming gate electrode 28. In one embodiment, hard mask layer 91 can be non-oxidizing film such a silicon nitride, which is formed overlying a dielectric layer 261. In this embodiment, dielectric layer 261 can be a silicon oxide.

In a subsequent step and in accordance with this embodiment, the upper surface of gate electrode 28 and the upper surfaces of the trench are exposed to a wet oxidation process at a temperature between 850 degrees Celsius and 950 degrees Celsius to form dielectric film 410. Dielectric film 410 can have a thickness of about 0.075 microns to about 0.35 microns or more. Hard mask layer 91 causes dielectric film 410 to form laterally below hard mask 91 in a "birds-beak" like manner. That is, dielectric film 410 includes portions 411 that overhang portions 418 of major surface 18.

In subsequent steps, body regions 31, source regions 33 and ILD layer 41 can be formed as shown in FIG. 11. In one embodiment, ILD layer 41 can be formed self-aligned to hard mask layer 91. In one embodiment, ILD layer 41 can be formed and then planarized using hard mask layer 91 as a stop-layer. Hard mask layer 91 can then be removed. Further, in accordance with the present embodiment, an etch such as a silicon etch is used to etch through source regions 33 to body regions 31 for forming body contact regions 36 as shown in FIG. 12. Portions 411 of dielectric film 410 shown in FIG. 10 are configured to overhang and block or mask the silicon etch, which forms source region 33 into a narrowed or slit-like shape. In one embodiment, a sloped silicon etch is used to form sloped sidewalls 331 of source regions 33 as shown in FIG. 12. In subsequent steps, conductive layers or plugs 43 can be formed. It was found that the wet oxidation process used to form dielectric layer 410 including portion 411 together with the sloped silicon etch resulted in the generation of regions 462 of elevated stress within source regions 33. Regions 462 of elevated stress beneficially propagate to channel regions 45, and were found using simulation results to reduce on-resistance by as much as 20%.

Figure 13:
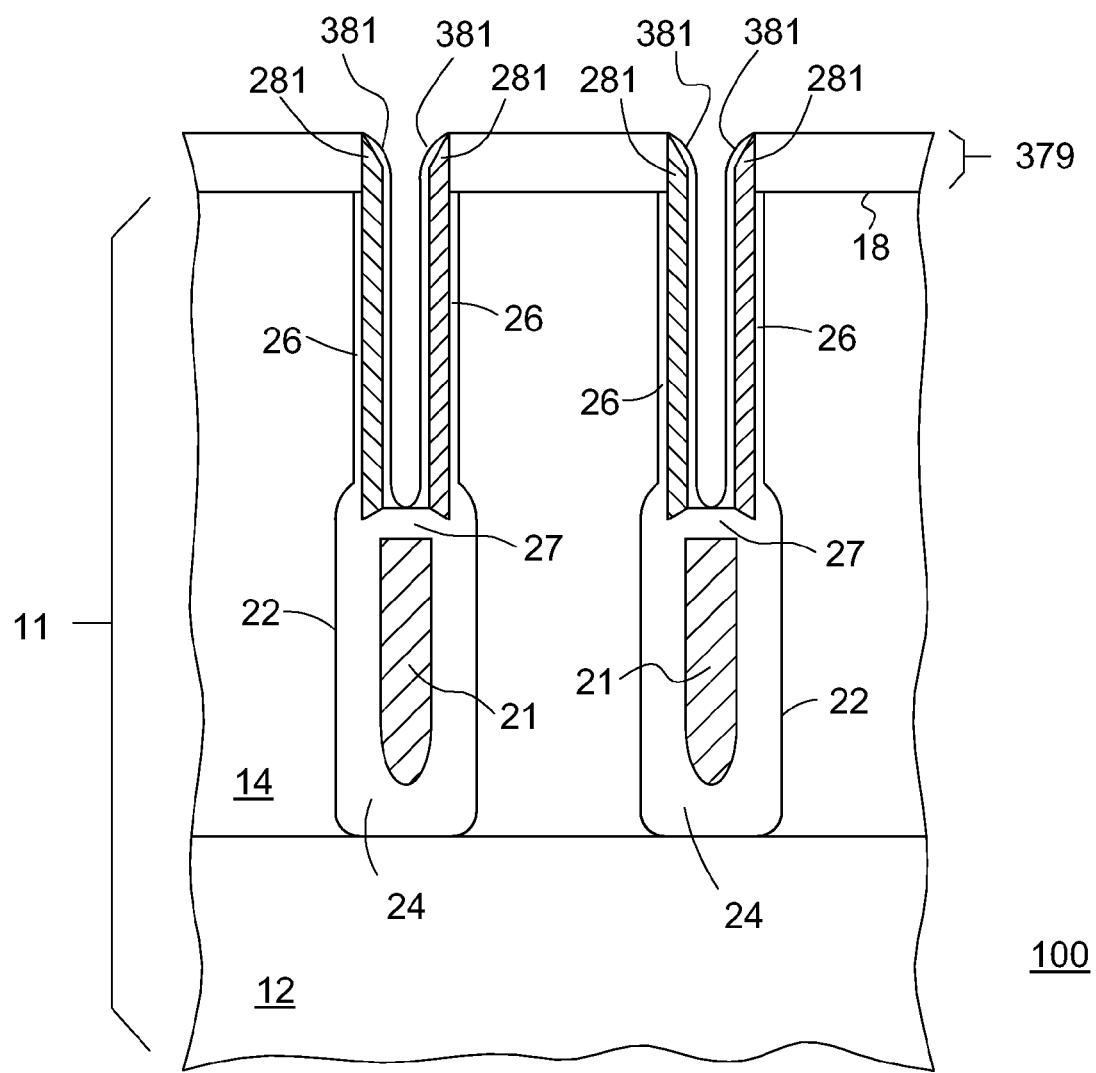
FIGS. 13-15 illustrate partial cross-sectional view of a further semiconductor device in accordance with the present invention at various stages of fabrication.
Figure 14:
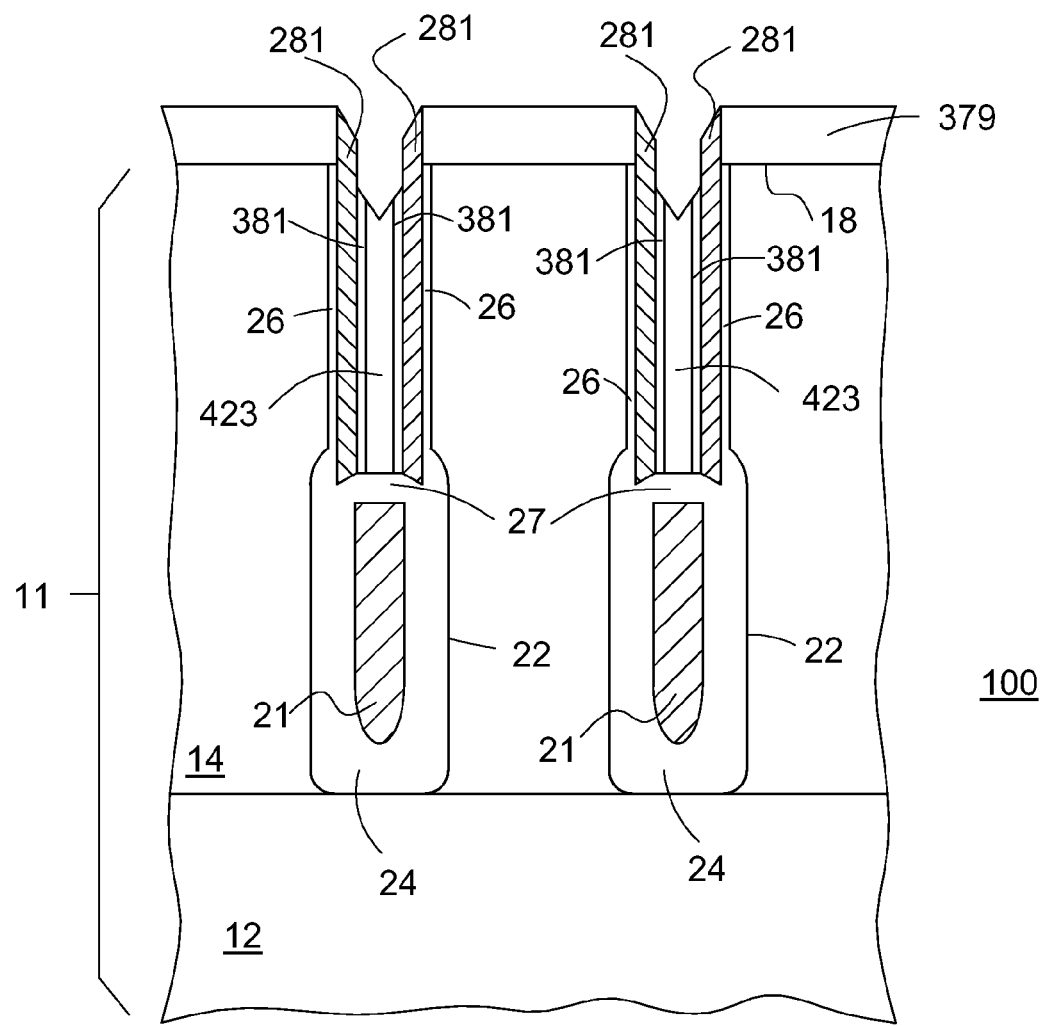
Figure 15:
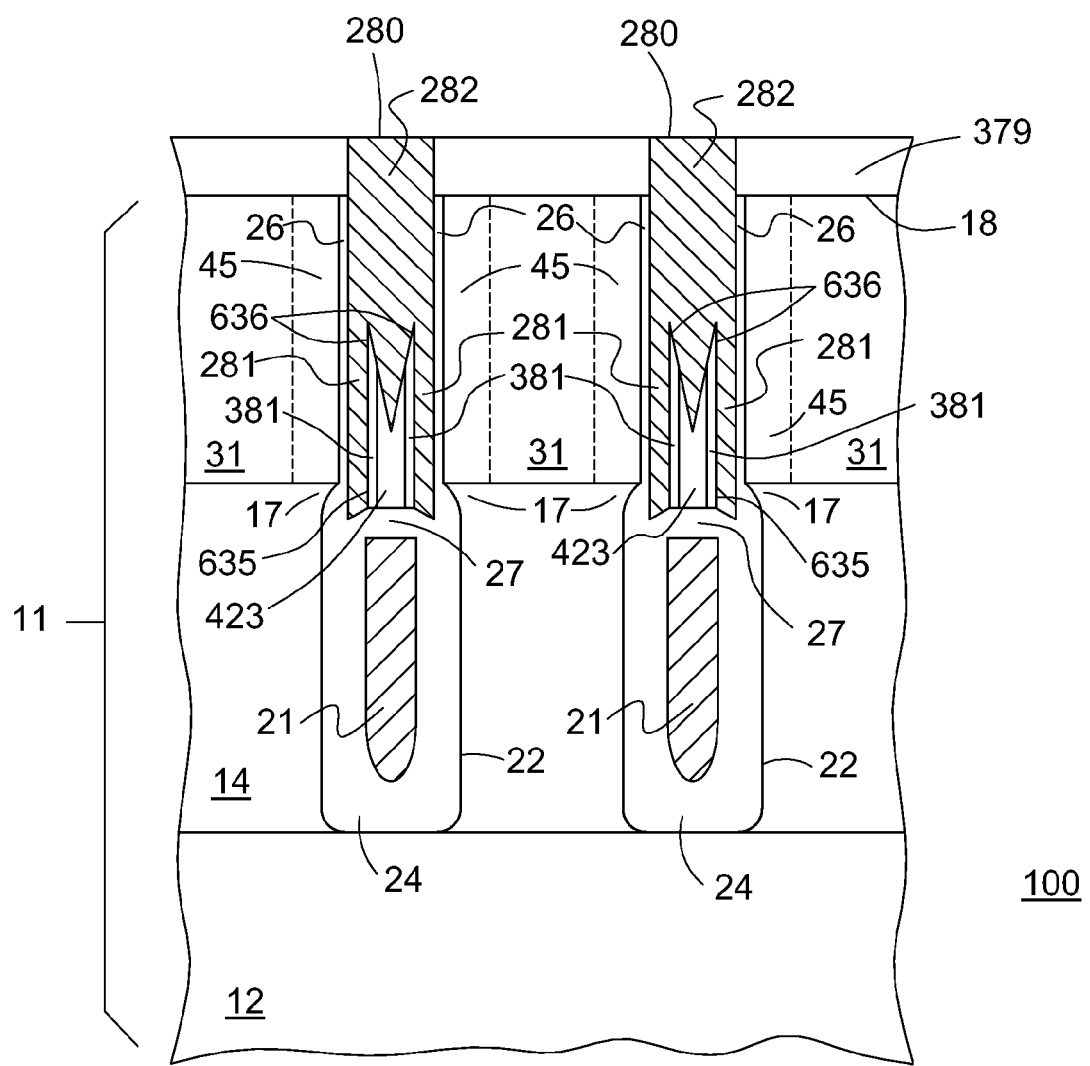

FIGS. 13-15 are partial cross-sectional views of a device 100 at early stages of fabrication. Device 100 is fabricated, for example, to include a feature 423, which is configured to create, propagate, induce, or generate stress within predetermined locations or regions of device 100. FIG. 13 shows device 100 at an intermediate step with a dielectric stack 379 formed overlying major surface 18 of region of semiconductor material 11. At this intermediate step, insulated shield electrodes 21 have been formed within lower portions of trenches 22. After insulator layers 27 have been formed, a polycrystalline semiconductor layer can be deposited overlying or adjacent dielectric stack 379, insulator layers 26 and insulator layer 27. In one embodiment, the polycrystalline semiconductor layer can be polysilicon that can be doped in-situ or after it is deposited. An anistropic etch can then used to form spacer layers 281 adjacent insulator layers 26 as shown in FIG. 13.

In one embodiment, layers 381 can be formed adjacent spacer layers 281. In one embodiment, layers 381 are configured for inducing stress within specific or predetermined locations or parts of device 100. For example, when device 100 comprises an n-channel device, layers 381 can be under compressive stress to induce a tensile stress within the predetermined locations or parts. Alternatively, when device 100 comprises a p-channel device, layers 381 can be under tensile stress to induce a compressive stress within the specific locations or parts. Layers 381 can comprise one or materials such as dielectric films including a silicon nitride, a silicon oxynitride, or a silicon oxide, or undoped polysilicon, or SIPOS, or combinations thereof, or the like. In one embodiment, layers 381 can comprise a silicide material. In one embodiment, layers 381 can be omitted.

In a subsequent step, a film or layer that induces stress within semiconductor layer 14 of device 100 is formed adjacent layers 381 and dielectric stack 379, and then etched back to form structures 423 as shown in FIG. 14. If layers 381 are used, layers 381 can also be etched back with structure 423. In one embodiment, structures 423 are configured for inducing stress within specific or predetermined locations or parts of device 100. For example, when device 100 comprises an n-channel device, structures 423 can be under compressive stress to induce a tensile stress within the predetermined locations or parts. Alternatively, when device 100 comprises a p-channel device, structures 423 can be under tensile stress to induce a compressive stress within the specific locations or parts. In one embodiment, structures 423 can comprise one or more materials such as dielectric films including a silicon nitride, a silicon oxynitride, or a silicon oxide, or undoped polysilicon, or SIPOS, or combinations thereof, or the like. Alternatively, structures 423 can comprise conductive films such as silicides or metals.

In a subsequent step, structures 423 (and layers 381) can be further etched back to a predetermined location within trenches 22 as shown in FIG. 15. In a subsequent step, conductive portions or regions 282 are formed overlying structure 423, and together with spacer layers 281, conductive portions 282 form gate electrodes 280. Body regions 31 are shown formed within region of semiconductor material 11. In this embodiment, structures 381 or/and 423 can be configured or placed to induce stress within channel regions 45 and upper portions of drift region 17. In one embodiment, structures 423 and layers 381 form a feature for inducing stress that includes a base portion 635 in proximity to the drain end of channel regions 45 and a pair of projections or pointed projections 636 that extend away from the base portion towards major surface 18.

From all of the foregoing, one skilled in the art can determine that according to one embodiment a semiconductor device comprises a region of semiconductor material having a major surface. A trench control structure is formed in the region of semiconductor material including a gate dielectric layer formed overlying sidewall surfaces of the trench control structure and a gate electrode (for example, element 28) comprising a first conductive material formed overlying the gate dielectric layer. A body region is formed within the region of semiconductor material and adjacent the trench control structure, where the trench control structure is configured to form a channel region (for example, element 45) within the body region. A source region (for example, element 33) is formed within the body region has a first side adjacent the trench control structure and a second side opposite to the first side. A first feature (for example, element 23, 32, 322, 421, 422, 423, 501) comprising a material other than the first conductive material is formed within the gate electrode, where the first feature is configured to induce stress within portions of the channel region.

Those skilled in the art will also appreciate that according to another embodiment, the trench control structure in the device described in the preceding paragraph further includes a shield electrode (for example, element 21) below the gate electrode, where the shield electrode is separated from the region of semiconductor material by a dielectric layer, where a second feature (for example, element 233, 323, 431, 432, 511) is formed within the shield electrode, where the second feature is configured to induce stress within a drift region of the semiconductor device.

Those skilled in the art will also appreciate that according to yet another embodiment, an insulating gate field effect transistor structure having enhanced mobility comprises a region of semiconductor material having a first conductivity type, a first major surface, and a second major surface opposing the first major surface, where the region of semiconductor material at the second major surface is configured as a drain region. A trench structure is formed within the region of semiconductor material comprising a shield electrode (for example, element 21) formed in a lower portion of a trench, where the shield electrode is separated from the region of semiconductor material by a first dielectric layer; a gate electrode (for example, element 28) formed in an upper portion of the trench, wherein the gate electrode is separated from the region of semiconductor material by a second dielectric layer and separated from the shield electrode by a third dielectric layer. A body region having a second conductivity type opposite to the first conductivity type is formed in the region of semiconductor material and adjacent to the trench structure, where the gate electrode is configured to form a channel region (for example, element 45) within the body region. A source region (for example, element 33) of the first conductivity type is formed in spaced relationship with the body region having a first side adjacent to the trench structure and a second side opposite to the first side. A first region (for example, element 23, 32, 322, 421, 422, 423, 501) is formed within the gate electrode and comprising a material that propagates stress within the region of semiconductor material adjacent to the trench control structure to provide the enhanced mobility.

Those skilled in the art will also appreciate that according to an additional embodiment, a method for forming a semiconductor device comprises steps of providing a region of semiconductor material having a major surface, and forming a trench control structure in the region of semiconductor material including a gate dielectric layer overlying sidewall surfaces of the trench control structure, a gate electrode (for example, element 28) comprising a first conductive material overlying the gate dielectric layer, and a first feature (for example, element 23, 32, 322, 421, 422, 423, 501) comprising a material other than the first conductive material within the gate electrode. The method includes forming a body region within the region of semiconductor material and adjacent the trench control structure, where the trench control structure is configured to form a channel region (for example, element 45) within the body region. The method includes forming a source region within the body region having a first side adjacent the trench control structure and a second side opposite to the first side, where the first feature is configured to induce stress within portions of the channel region.

Those skilled in the art will also appreciate that according to a further embodiment, a method for forming a semiconductor device having enhanced mobility comprises the steps of providing a semiconductor material having a major surface and a drift region, where the device is configured as a vertical power semiconductor device. The method includes forming a trench control structure in the region of semiconductor material including a gate dielectric layer overlying sidewall surfaces of the trench control structure and a gate electrode comprising a first conductive material overlying the gate dielectric layer. The method includes forming a body region within the region of semiconductor material and adjacent the trench control structure, where the trench control structure is configured to form a channel region (for example, element 45) within the body region, and forming a source region within the body region. The method includes forming dielectric features (for example, element 23, 231, 32, 62, 322, 334, 411, 420, 421, 501) in spaced relationship with the semiconductor material, where the dielectric features form stressed regions that propagate stress in proximity to the channel region.

Those skilled in the art will also appreciate that according to a further embodiment, the step of forming the dielectric features in the method described in preceding paragraph comprises the steps of forming a contact trench extending through the source region to form first and second source region portions and forming a dielectric layer overlying exposing sidewall and lower surfaces of the contact trench, where the dielectric layer has thicker portions (for example, element 62) overlying the sidewall surfaces adjoining the first and second source regions portions, and where the dielectric features comprise the thicker portions.

Those skilled in the art will also appreciate that according to a still further embodiment, the step of forming the trench control structure in the method described in the paragraph [0053] comprises the steps of forming a hard mask layer (for example, element 91) overlying the major surface and having an opening, forming a trench within the semiconductor material through the opening, forming the gate dielectric layer overlying sidewalls of the trench, and forming the gate electrode recessed within the trench below the major surface. Also, where the step of forming the dielectric features comprises oxidizing upper portions of the sidewalls of the trench using the hard mask layer as an oxidation mask to form the dielectric features (for example, element 411) overlying portions (for example, element 418) of the major surface adjacent the trench and below the hard mask layer; and where the step of forming the source regions comprises forming the source regions within the body region in proximity to the dielectric regions and the gate electrode. In addition, the method further comprises the steps of forming contact trenches adjacent the source regions, where the forming the contact trenches step forms sloped sidewalls (for example, element 331) along portions of the source regions, and forming contact layers within the contact trenches.

In view of all the above, it is evident that a novel device and method is disclosed. Included, among other features, is forming one or more structures in a control structure, contact structures, or current carrying regions that propagate stress within certain regions of the device to provide the unexpected advantage of improving carrier mobility and reducing on-resistance. For example, placing a dielectric film within a conductive gate electrode in proximity to a channel region of a vertical power MOSFET device increases carrier mobility within the channel region.

Although the subject matter of the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device comprising:
   a region of semiconductor material having a major surface;
   a trench control structure in the region of semiconductor material including a gate dielectric layer adjacent sidewall surfaces of the trench control structure and a gate electrode comprising a first conductive material overlying the gate dielectric layer, where the trench control structure further includes a shield electrode below the gate electrode, where the shield electrode is separated from the region of semiconductor material by a dielectric layer;
   a body region within the region of semiconductor material and adjacent the trench control structure, where the trench control structure is configured to form a channel region within the body region, where the channel region includes a source end and a drain end;
   a source region within the body region having a first side adjacent the trench control structure and a second side opposite to the first side;
   a first feature comprising a material other than the first conductive material within the gate electrode, where the first feature is configured to induce stress within portions of the channel region; and
   a second feature within the shield electrode, where the second feature is configured to induce stress within a drift region of the semiconductor device.

2. The device of claim 1, where the first feature comprises a dielectric material.

3. The device of claim 1, where an edge of the first feature is placed within about 0.2 microns of the channel region.

4. The device of claim 1, where the first feature comprises two different materials, and where the first feature comprises a base portion in proximity to the drain end and a pair of pointed projections extending away from the base portion towards the major surface.

5. The device of claim 1, further comprising a third feature overlying the gate electrode and configured to induce stress in proximity to the source end of the channel.

6. The device of claim 1, where one of the first feature and the second feature comprises a composite structure.

7. The device of claim 1, where the second feature comprises a dielectric material.

8. The device of claim 1 further comprising a third feature adjoining the second side of the source, where the third feature is configured to induce stress in proximity to the source end of the channel region.

9. The device of claim 1 further comprising a second feature adjacent to opposing corners of the gate electrode in proximity to the drain end of the channel region and configured to induce stress within the drain end of the channel region.

10. The device of claim 1 further comprising a third feature adjoining the second side of the source, where the third feature is configured to induce stress in proximity to the source end of the channel region.

11. The device of claim 1 further comprising a third feature adjacent to opposing corners of the gate electrode in proximity to the drain end of the channel region and configured to induce stress within the drain end of the channel region.

12. An insulating gate field effect transistor structure having enhanced mobility comprising:
    a region of semiconductor material having a first conductivity type, a first major surface, and a second major surface opposing the first major surface, where the region of semiconductor material at the second major surface is configured as a drain region;
    a trench structure within the region of semiconductor material comprising a shield electrode in a lower portion of a trench, where the shield electrode is separated from the region of semiconductor material by a first dielectric layer, and a gate electrode in an upper portion of the trench, wherein the gate electrode is separated from the region of semiconductor material by a second dielectric layer and separated from the shield electrode by a third dielectric layer;
    a body region having a second conductivity type opposite to the first conductivity type in the region of semiconductor material and adjacent to the trench structure, where the gate electrode is configured to form a channel region within the body region;
    a source region of the first conductivity type in spaced relationship with the body region having a first side adjacent to the trench structure and a second side opposite to the first side;
    a first region within the gate electrode and comprising a material configured to propagate stress within the region of semiconductor material adjacent to the trench control structure; and
    a second region formed within the shield electrode and comprising a material configured to propagate stress within a drift region of the structure.

13. The structure of claim 12, where the first region comprises a dielectric material.

14. The structure of claim 13, where the first region comprises silicon nitride.

15. The structure of claim 12 further comprising a third region between the shield electrode and the gate electrode and comprising a material configured to propagates stress in proximity to a drain end of the channel region.

16. The structure of claim 12, where both the first and second regions comprise dielectric materials.

17. The structure of claim 12 further comprising a third region overlying the shield electrode and a fourth region overlying the gate electrode, where both the third and fourth regions comprise material configured to propagate stress within the region of semiconductor material adjacent to the trench structure.

18. The structure of claim 12 further comprising a third region adjacent to the second side of the source region and comprising a material configured to propagate stress in proximity to a source end of the channel region.

19. The structure of claim 18, where the third region comprises a dielectric material.

20. A method for forming a semiconductor device comprising the steps of:
    providing a region of semiconductor material having a major surface;
    forming a trench control structure in the region of semiconductor material including a shield electrode separated from the region of semiconductor material by a dielectric layer, a first feature formed within the shield electrode, a gate dielectric layer overlying sidewall surfaces of the trench control structure, a gate electrode comprising a first conductive material overlying the gate dielectric layer, and a second feature comprising a material other than the first conductive material within the gate electrode;
    forming a body region within the region of semiconductor material and adjacent the trench control structure, where the trench control structure is configured to form a channel region within the body region; and
    forming a source region within the body region having a first side adjacent the trench control structure and a second side opposite to the first side, where the first feature is configured to induce stress within a drift region of the semiconductor device, and where the second feature is configured to induce stress within portions of the channel region.

21. The method of claim 20, where the step of forming the trench control structure includes forming the trench control structure where the second feature comprises a dielectric material.

22. The method of claim 21 further comprising the step of forming a third feature between the second feature and the channel region, where the third feature comprises a material different than the second feature and the first conductive material.

23. The method of claim 20, where the step of forming the trench control structure includes forming the trench control structure where an edge of the second feature is within about 0.2 microns of the channel region.

24. The method of claim 20, where the step of forming the trench control structure includes forming the trench control structure where the second feature comprises two different materials.

25. The method of claim 20 further comprising the step of forming a third feature overlying the gate electrode, where the third feature is configured to induce stress within portions of the channel regions.

26. The method of claim 20, where the step of forming the trench control structure comprises forming the trench control structure where the second feature comprises a plurality of spaced-apart stripe-like shapes.

27. The method of claim 20, where the step of forming the trench control structure comprises forming the trench control structure where the first feature comprises a plurality of spaced-apart stripe-like shapes.

28. The method of claim 20, where the step of forming the trench control structure comprises the steps of:
    forming the gate dielectric layer adjacent side surfaces of a trench;
    forming a conductive layer adjacent the gate dielectric layer;
    forming the second feature adjacent the conductive layer; and
    forming a conductive region adjacent the second feature and coupled to the conductive layer, where the conductive region and the conductive layer form the gate electrode.

29. The method of claim 28 further comprising the step of removing a portion of the conductive layer to form spacer layers.

30. The method of claim 28 further comprising the step of forming a layer of material between at least a portion the conductive layer and the second feature, where the layer of material is configured to induce stress within the channel region.

31. A method of forming a semiconductor device having enhanced mobility comprising the steps of:
    providing a semiconductor material having a major surface and a drift region, where the device is configured as a vertical power semiconductor device;
    forming a trench control structure in the region of semiconductor material including a gate dielectric layer overlying sidewall surfaces of the trench control structure and a gate electrode comprising a first conductive material overlying the gate dielectric layer;
    forming a body region within the region of semiconductor material and adjacent the trench control structure, where the trench control structure is configured to form a channel region within the body region;
    forming a source region within the body region;
    forming a contact trench extending within the source region to form first and second source region portions; and
    forming a dielectric layer overlying exposed sidewall and lower surfaces of the contact trench, where the dielectric layer has thicker portions adjacent the sidewall surfaces, and where the thicker portions form dielectric features in spaced relationship with the semiconductor material, and where the dielectric features form stressed regions that propagate stress in proximity to the channel region.

32. The method of claim 31 further comprising the step of forming a feature within the gate electrode, where the feature comprises a material other than the first conductive material, and where the first feature is configured to induce stress within the channel region.

33. The method of claim 31 further comprising the steps of:
    forming an enhancement region within the body region using the dielectric layer as a dopant mask;
    removing the dielectric layer; and
    forming a contact region within the contact trench.

34. The method of claim 31, where the step of forming the dielectric layer includes forming an oxide layer using wet oxidation at a temperature from between 825 degrees Celsius and 925 degrees Celsius.

35. A method of forming a semiconductor device having enhanced mobility comprising the steps of:
    providing a semiconductor material having a major surface and a drift region, where the device is configured as a vertical power semiconductor device;
    forming a hard mask layer overlying the major surface and having an opening;

forming a trench within the semiconductor material through the opening;

forming a gate dielectric layer overlying sidewalls of the trench;

forming a gate electrode recessed within the trench below the major surface, where the trench, gate dielectric layer and gate electrode are configured as a trench control structure;

oxidizing an upper portion of a sidewall of the trench using the hard mask layer as an oxidation mask to form a dielectric feature overlying a portion of the major surface adjacent the trench and below the hard mask layer;

forming a body region within the region of semiconductor material and adjacent the trench control structure, where the trench control structure is configured to form a channel region within the body region, and where the dielectric feature forms a stressed region that propagates stress in proximity to the channel region;

forming a source region within the body region in proximity to the dielectric feature and the gate electrode;

forming a contact trench adjacent the source region, where the forming the contact trench step forms a sloped sidewalls along a portion of the source region; and forming a contact layer within the contact trench.

* * * * *